United States Patent
Cheong et al.

(10) Patent No.: US 8,558,726 B2
(45) Date of Patent: Oct. 15, 2013

(54) TESTING OF ANALOG-TO-DIGITAL CONVERTERS

(75) Inventors: Chee Weng Cheong, Singapore (SG); Kien Beng Tan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 13/339,649

(22) Filed: Dec. 29, 2011

(65) Prior Publication Data

US 2013/0169456 A1 Jul. 4, 2013

(51) Int. Cl.
*H03M 1/10* (2006.01)

(52) U.S. Cl.
USPC .............................. 341/120; 341/155; 341/154

(58) Field of Classification Search
USPC .................. 341/155, 159, 154, 118, 119, 120
See application file for complete search history.

(56) References Cited

U.S. PATENT DOCUMENTS

| | | | | |
|---|---|---|---|---|
| 5,936,566 | A * | 8/1999 | Park | 341/159 |
| 6,288,661 | B1 * | 9/2001 | Holberg | 341/145 |
| 6,414,619 | B1 * | 7/2002 | Swanson | 341/155 |
| 7,535,395 | B2 * | 5/2009 | Voicu et al. | 341/144 |

* cited by examiner

*Primary Examiner* — Jean B Jeanglaude
(74) *Attorney, Agent, or Firm* — Wolf, Greenfield & Sacks, P.C.

(57) ABSTRACT

Complete testing of an analog-to-digital converter (ADC) can be carried out using digital signals and at high speeds. Circuit elements are added to an ADC so that a first phase of testing may be carried out using a limited number of analog test voltages. The ADC may then be reconfigured using added circuit elements to disable conventional analog-to-digital conversion. A digital signal may then be applied to the ADC to rapidly test all switching elements used in analog-to-digital conversion. According to some implementations, testing times for ADCs may be reduced from hours to milliseconds.

17 Claims, 3 Drawing Sheets

TESTING OF ANALOG-TO-DIGITAL CONVERTERS

BACKGROUND

1. Technical Field

The invention relates to a system, apparatus and methods for high-speed testing of analog-to-digital converters.

2. Discussion of the Related Art

Production testing of analog-to-digital converters (ADCs) using analog testing techniques can be very time consuming. For example, complete testing of all circuit elements in a 10-bit ADC would require $2^{10}$ (i.e., 1024) tests at discrete analog voltage levels to completely test the hardware circuitry of the ADC. The complete testing of an ADC using such methods can take several hours, and testing of higher resolution ADCs would take correspondingly longer times.

Because of the prohibitively long times associated with complete testing of ADCs, only partial testing of an ADC is typically carried out during manufacture. In partial testing, only a limited set of pre-selected conversion codes are tested, and it is assumed that if the device works for the limited set of codes it will likely work for all conversion codes. However, partial testing can only ensure that hardware relating to the selected codes performs as expected, and there is no guarantee that untested hardware relating to non-selected codes will work. Since only a few codes of the total possible 1024 codes are used in testing, there is a high probability that an ADC that is considered to have passed production testing may fail during normal use.

SUMMARY

The present invention relates to apparatus and methods for enabling complete, high-speed testing of analog-to-digital converters. The inventors have recognized that complete testing of all circuitry in an ADC can require prohibitively long testing times, and that partial testing of an ADC cannot guarantee failure-free operation of the ADC. The inventors have developed modifications to an ADC that permit rapid testing (e.g., less than one second) of all circuit elements in an ADC.

According to one embodiment, an analog-to-digital converter (ADC) configured for digital testing comprises a plurality of switches for use in converting an analog input voltage to a digital output code corresponding to the analog input voltage, and a digital test input configured to receive a digital test signal for activating the plurality of switches. The digital test input may be coupled to control logic (e.g., control logic for a successive approximation register) configured to activate the plurality of switches. The ADC may further include a resistive network coupled to the plurality of switches, a comparator coupled at a first input to an analog voltage input for the ADC and coupled at a second input to an output from the plurality of switches. The resistive network and plurality of switches may be configured to alter the voltage at the second input of the comparator.

The invention also includes methods associated with the ADC described above. In one embodiment, a method of testing an analog-to-digital converter (ADC) comprises digitally testing at least some internal conversion circuit elements of the ADC with an externally applied digital signal. The extern digital signal may be applied to a digital input port of the ADC. The method may further comprise bypassing or disabling analog-to-digital conversion in the ADC during the act of digitally testing the internal circuit elements of the ADC. The internal circuit elements may be a plurality of switches that are used in the process of converting analog signal values to digital codes representative of the analog signal values. The method may further include applying a test voltage to a resistive network coupled to the plurality of switches, measuring an output from the plurality of switches, and determining whether the at least one of the plurality of switches is functioning based upon the measured output.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Figure 1:
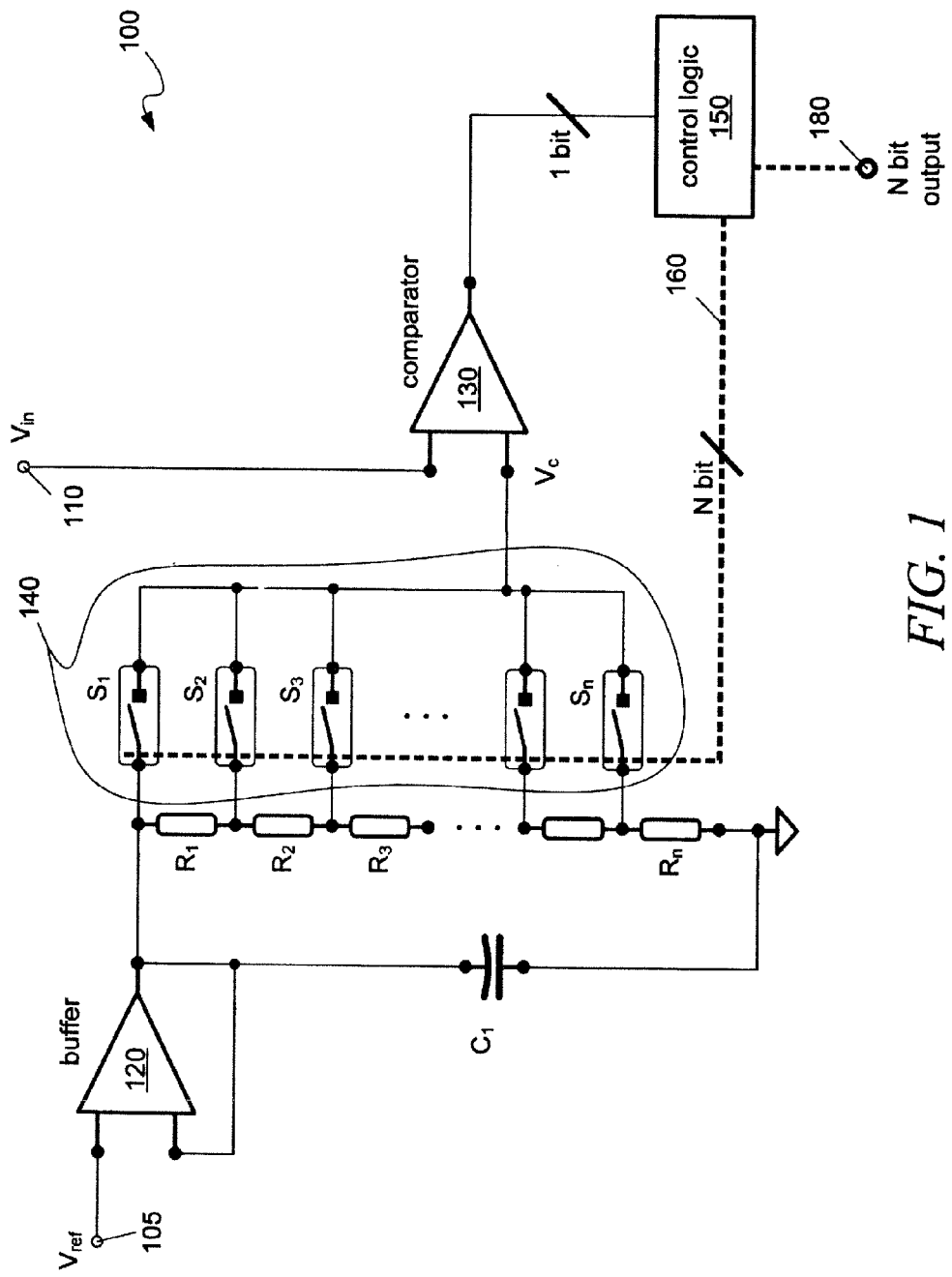
FIG. 1 is a depiction of a conventional analog-to-digital converter.

By way of introduction and without limiting an ADC of the invention to any one particular design, an example of a conventional analog-to-digital converter 100 is depicted in FIG. 1. The ADC may comprise an input terminal 110 to which an analog input voltage $V_{in}$ is applied, and a digital output 180 providing an N bit digital signal code corresponding to the analog voltage level at the input terminal 110 of the ADC. The ADC 100 may operate using a successive approximation register (SAR), which may comprise a resistive dividing network ($R_1, R_2, \ldots R_n$), a bank of switches 140 ($S_1, S_2, \ldots S_n$), and a SAR controller 150. Resistive network, switch bank 140, comparator 130, and switch control 150 may all be used in converting an analog signal at input terminal 110 to a digital N-bit code at output 180. A reference voltage source $V_{ref}$ (e.g., a supply voltage) may be coupled to the resistive network through buffer 120, and a capacitor $C_1$. The capacitor may be used, or filtering circuitry may be used and/or added to the input terminal, to reduce noise in the ADC and improve accuracy of signal conversion.

In operation, the input analog voltage $V_{in}$ may be applied to a first input of a comparator 130. The second input of the comparator 130 may receive a comparison voltage K. from the bank of switches 140. The comparison voltage may be derived from the reference voltage source $V_{ref}$ through the resistive network depending upon which switches are closed or open. Depending on the comparison of $V_{in}$ and $V_c$, comparator 130 will output either a high or low bit to SAR control logic 150. In response, the controller 150 issues an N-bit signal 160 to control the bank of switches 140 so as to adjust the comparison voltage up or down. The process may be iterated over a number of clock cycles, during which the value of $V_c$ will converge to the value of $V_{in}$. When the comparison voltage is approximately equal to the input analog voltage, a corresponding N-bit digital value is provided at the digital output 180.

The inventors have appreciated that complete testing of an ADC, such as the one depicted in FIG. 1, can require a large number of accurate analog voltage levels. For example, for an ADC having 10 bit resolution, $2^{10}$ or 1024 relatively accurate analog voltage values $V_{in}$ must be applied to the ADCs input terminal 110, so as to ensure that all the resistors, switches, and the comparator 130 are tested to be functioning properly for all of the input voltage values. Testing with such a large number of input voltages can be very time consuming. As an example, to test an ADC over a full range of about 1 V, analog voltages of ≈1 mV (1/1024), ≈2 mV (2/1024), . . . 1 V (i.e. in steps of about 1 mV) will have to be applied to $V_{in}$ to completely test the hardware of the ADC. However due to noise issues related to the analog signals, a smaller voltage step than 1 mV is applied in practice. For example, a voltage step of about a tenth of a millivolt is typically applied (≈0.1 mV, ≈0.2 mV . . . 1 V), so as to change the voltage gradually. Furthermore, the test may repeated several times (about 10 times) to improve the confidence of the test results. An additional complication is that once the analog voltage is stepped (for example, from 0.1 mV to 0.2 mV), an appreciable settling time is required for the analog voltage to settle down so as to be reasonably accurate for a measurement. In practice, the settling time may be on the order of 250 milliseconds. As a result of the various testing constraints, the total time required to cycle through all 1024 analog voltages so as to test all resistors and switches can be around (1024*10*10*0.25 s)=25,000 seconds, which is about 7 hours. To avoid such long testing times, high-resolution ADCs are typically tested only partially as noted above.

Recognizing the difficulties associated with conventional testing of ADCs, the inventors have developed a way to carry out complete and rapid testing of ADCs. Rather than requiring hours for complete testing, the methods and apparatus described herein enable complete testing of ADCs on time scales of seconds or less. In some cases, the testing can be completed in milliseconds. Additionally, the testing does not require a large plurality of accurate analog voltage levels.

Figure 2:
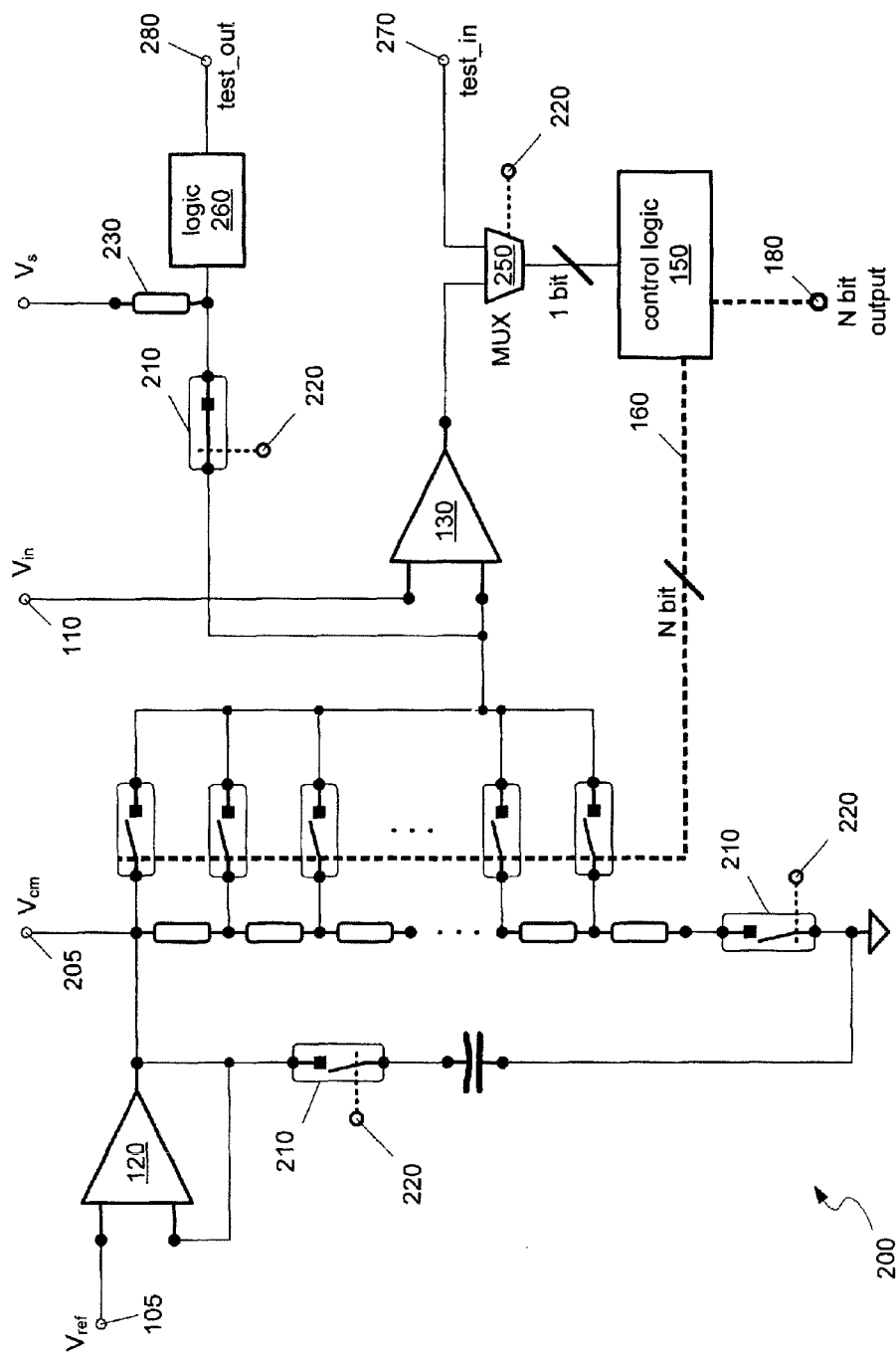
FIG. 2 illustrates modifications that can be made to an analog-to-digital converter to enable rapid and complete testing of the ADC, according to one embodiment of the invention.

FIG. 2 depicts one embodiment of an ADC configured for rapid and complete testing of the ADC's circuitry. Several modifications have been made to the ADC of FIG. 2, as can be seen in comparison with FIG. 1. Additional inputs 205, 220, and 270 have been added to the ADC, and an additional test output 280 added. Also, switches 210, multiplexor 250, and a high impedance pull-up resistor 230 have been added. In some embodiments, additional logic 260 may be added for processing the test output signal. Though FIG. 2 depicts an ADC that uses a successive approximation register, similar modifications and techniques described herein may apply to other types of ADCs.

Voltage input 205 is coupled to the resistive network and may be configured to receive an externally applied analog or digital voltage signal. Test enabling inputs 220 (there are four shown for the embodiment of FIG. 2) couple to switches 210 to activate or deactivate the switches, and also couple to multiplexor 250 to select a signal to be applied to control logic 150. The switches 210, as well as the switches in the switch bank 140, may be p- or n-type field-effect transistors (FETs) in some embodiments. In some implementations, the switches may be microelectromechanical (MEM) switches.

Test input 270 couples to the successive approximation register control logic 150 through multiplexor 250. Test output 280 couples to the second input of comparator 130 through switch 210. The switches 210 are depicted as being in a "digital test enable" state, with some open, and one closed. In the digital test enable state, multiplexor 250 is activated to select the signal from test input 270 for transmission to control logic 150.

To test the ADC depicted in FIG. 2, a signal may be applied at inputs 220 to set the switches 210 in a "digital test disable" state in a first phase of test measurements. In this state, the switches 210 depicted as open would be closed and the one depicted as closed would be open. Additionally, output from comparator 130 would be selected at multiplexor 250 for transmission to control logic 150. In this testing state, the circuit of FIG. 2 would be configured to operate normally for digital-to-analog conversion, like the circuit of FIG. 1. One or a limited number (e.g., fewer than 10) of analog voltage levels may be applied to $V_{in}$ to test the circuit conventionally in this first phase of testing. In one example, three voltage levels (e.g., low, mid-range, and high voltage levels) could be applied at the input terminal 110. Such limited testing would assure that comparator 130 functions properly. Signal input 205 may not be used in the first phase of testing.

In a second phase of test measurements, a signal may be applied at inputs 220 to set the switches 210 in a "digital test enable" state as depicted in FIG. 2. In this state, the resistive network is isolated from ground and the output of the comparator 130 is de-selected, so that analog to digital conversion is disabled or bypassed. Instead, a digital signal "test_in" at input 270 can be applied to the SAR control logic 150 to control switches in the switch bank 140. Additionally, any selected voltage level $V_{cm}$ may be applied to the resistive network at input 205.

In this second phase of measurements, the switches $S_1$, $S_2$, . . . $S_n$ in switch bank 140 may be activated individually in any desired manner using an externally applied digital signal at test input 270. As one example, the externally applied digital signal may be selected to program SAR logic 150 to activate one switch at a time. The "test_in" signal may comprise sequences of N bits, where N corresponds to the number of switches in the switch bank 140 or the bit resolution of the ADC. The sequences of N-bit signals may program the SAR logic to activate one switch at a time. For example, if ADC 200 is an 8-bit converter, a digital test signal sequence may comprise the following sequence of 8-bit data blocks to individually activate switches in the switch bank: ([10000000], [01000000], [00100000], . . . [00000001]). Other digital test signal sequences and block values may be used, e.g., a sequence that randomizes activation of the switches in switch bank 140, and block values that activate more than one switch at a time.

When all switches in the bank of switches are open, voltage $V_s$, or a corresponding voltage in accordance with signal processing logic 260, will appear at test output 280. When any of the switches in the bank closes, a voltage approximately equal to $V_{cm}$ will appear at test output 280. The output voltage may depend upon any series resistance in the switches and the resistance of the pull-up resistor 230, as well as any input impedance in logic 260. The signal may also be conditioned by logic 260, e.g., amplified, compared, or scaled. As will be appreciated, changes detected at the test output 280 (e.g., from a voltage level of $V_s$ to $V_{cm}$) responsive to activation of one or more switches in the switch bank 140 will confirm that the one or more switches is operating properly. In this manner, all switches in switch bank 140 can be rapidly tested by the application of a digital signal at test input 270.

In some embodiments, the voltage $V_{cm}$ may be varied between or during testing of one or more switches in switch bank 140. This may provide added assurance that each switch is operating properly. As one example, a first switch in switch bank 140 may be closed while $V_{cm}$ is at a first value. $V_{cm}$ may be maintained at the first value, changed to a second value, or varied in value while the switch is closed. Alternatively, the first switch may be opened and closed between or during the application of one or more voltage values $V_{cm}$. In some cases $V_{cm}$ may be varied over an operating voltage range of the ADC to verify that the switches function properly at all operating voltages.

In some embodiments, output logic 260 may provide a digital output signal, e.g., a logic "1" indicating a detected $V_{cm}$ and a properly functioning switch or a logic "0" indicating a detected $V_s$ and a non-functioning switch. In one embodiment, logic 260 may comprise a simple comparator comparing a signal received from switch bank 140 with a supply voltage $V_s$. In other embodiments, output logic 260 may provide an analog signal, e.g., a buffered or amplified signal received from switch bank 140.

As can be appreciated, the methods and apparatus for testing ADCs according to the above embodiments do not require a plurality of accurate analog voltage levels to test all switches in the ADC. In some cases, only digital signals may be used to test the switches. For example, signals applied to test enable inputs 220 and test signal input 270 and signals received from test output 280 may all be digital signals. With digital signals, measurements are significantly more resistant to noise, and delays associated with analog signal settling times can be avoided. With higher resistance to noise, repetitive testing at a single test value may, in some embodiments, not be necessary. As a result, the testing time can be greatly reduced using the modifications such as those depicted in FIG. 2 and associated methods. As one example, complete testing of a 10-bit ADC using the procedures and apparatus described above can be carried out in less than one second. In one trial, the inventors were able to completely test a 10-bit ADC in about 4 milliseconds. This represents a significant improvement in terms of time and cost compared with conventional methods which could require several hours of testing for the same 10-bit ADC.

Figure 3:
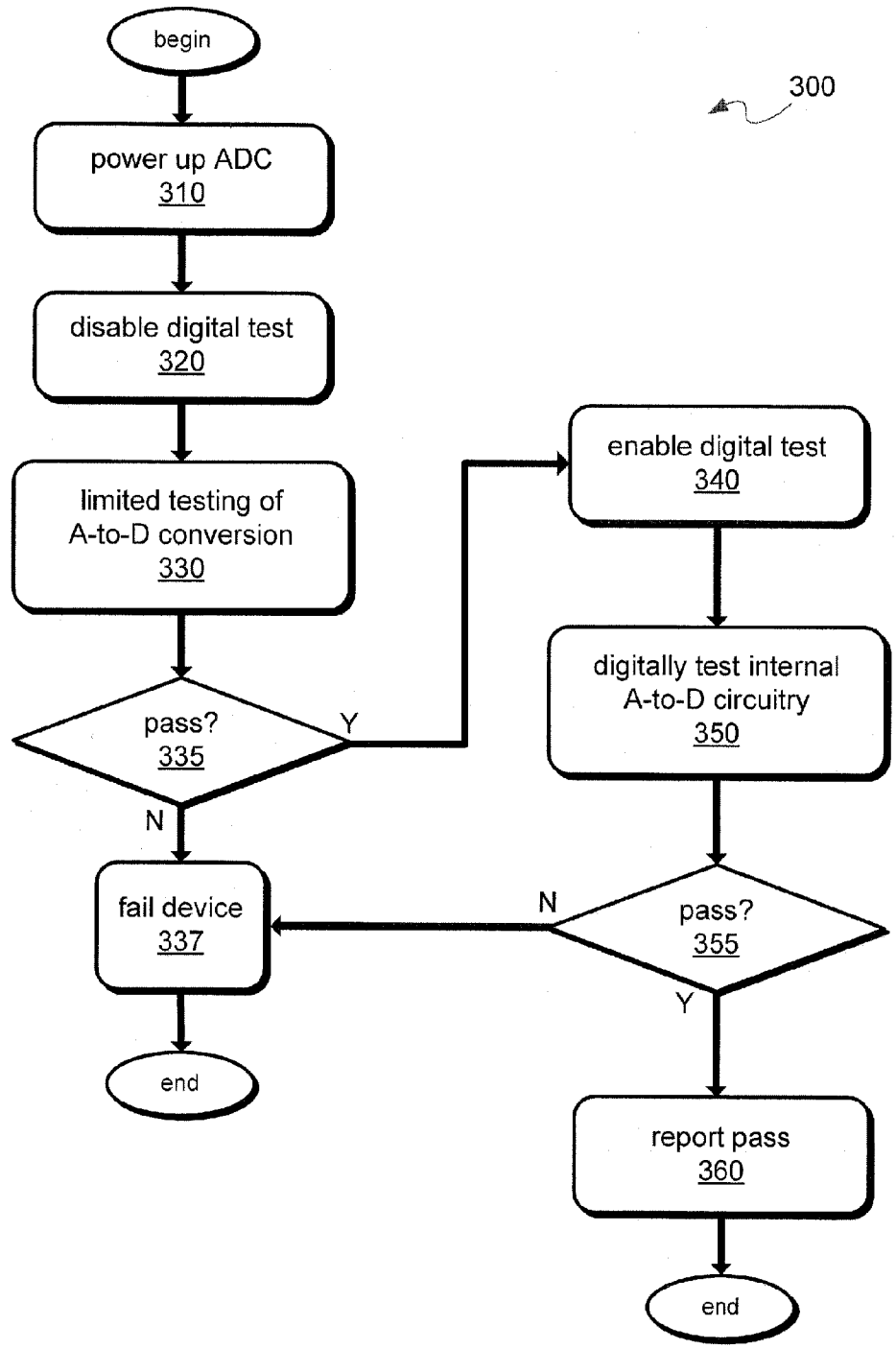
FIG. 3 depicts a flow chart of a process for complete testing of an analog-to-digital converter, according to one embodiment of the invention.

FIG. 3 represents a flow chart of a method 300 for testing an ADC, according to one embodiment of the invention. The method may begin with powering 310 up the ADC, and disabling 320 digital test elements. Limited testing 330 of at least some targeted analog-to-digital circuit elements within the ADC may be carried out using a limited number of selected analog voltages applied to an analog input of the device. The limited testing 330 may verify that the targeted elements are operating properly. For example and referring to FIG. 2, testing may be carried out using a limited number of analog input voltages values $V_{in}$ to verify that comparator 130 is operating properly. If the limited testing verifies that selected analog-to-digital circuit elements are operating properly, the method may initially pass 335 the ADC to a next phase of testing. If the limited testing reveals that at least some of the selected analog-to-digital circuit elements are not operating properly, the method may not pass the ADC and instead fail 337 the device before ending.

In a second phase of testing, the method 300 may include enabling 340 digital test circuit elements and/or testing ports for the device. Referring again to FIG. 2, enabling 340 may comprise activating internal switches 210 and multiplexor 250. The method 300 may further include digitally testing 350 internal circuitry of the ADC, e.g., by the application of a digital test signal to a digital test input terminal of the ADC. In one embodiment, digital testing 350 may comprise testing a plurality of switches of a successive approximation register portion of the ADC using digital signals applied to a test input terminal to activate the switches and monitoring a test output terminal to verify proper activation of the switches responsive to the applied digital signals. If it is determined that the ADC circuitry that is digitally tested operates properly, the method 300 may include passing 355 the device and reporting 360 successful operation of the ADC. If it is determined that the ADC circuitry that is digitally tested does not operate properly, the method 300 may not pass the device and fail the device 337.

In some implementations, data indicative of failure modes may be retained and reported. The data may be retained by a processing system coupled to the ADC that provides digital and/or analog signals for testing the ADC. For example, failure at step 335 after analog testing may be distinguished from failure at step 355 after digital testing. In some embodiments, details of failure may further be provided for each mode, e.g., voltage levels at which analog conversion fails, number and/or identification of failed switches.

In another embodiment of the invention and referring again to FIG. 2, test input 270 and multiplexor 250 may be moved after control logic 150. In such a configuration, multiplexor 250 would select either an N-bit output from control logic (for normal analog testing), or an N-bit digital test input signal (for digital testing of switches in the switch bank 140).

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element or item in the specification does not by itself connote any priority, presence or order of one element over another. In addition, the use of an ordinal term does not by itself connote a maximum number of elements having a certain name that can be present in a claimed device or method. Any suitable number of additional elements may be used unless a claim requires otherwise. Ordinal terms are used in the claims merely as labels to distinguish one element having a certain name from another element having a same name. The use of terms such as "at least one" or "at least a first" in the claims to modify a claim element does not by itself connote that any other claim element lacking a similar modifier is limited to the presence of only a single element. Any suitable number of additional elements may be used unless a claim requires otherwise. The use of "including," "comprising," or "having," "containing," "involving," and variations thereof herein, is meant to encompass the items listed thereafter and equivalents thereof as well as additional items.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A method of testing an analog-to-digital converter (ADC) that includes a resistive network for converting analog signals, the method comprising:
isolating one end of the resistive network from any reference potential while recording a test measurement; and
digitally testing internal conversion circuit elements of the ADC with an externally applied digital signal.

2. The method of claim 1, further comprising bypassing or disabling analog-to-digital conversion in the ADC during the act of digitally testing the internal conversion circuit elements of the ADC.

3. The method of claim 2, further comprising:
enabling analog-to-digital conversion in the ADC;
applying less than about 10 analog voltage values to an analog input of the ADC; and
measuring analog-to-digital conversion for the applied analog voltage values.

4. The method of claim 1, wherein the internal conversion circuit elements comprise a plurality of switches in the ADC and the digitally testing activates at least one of the plurality of switches.

5. The method of claim 4, further comprising:
applying a test voltage to a resistive network coupled to the plurality of switches;
measuring an output from the plurality of switches; and
determining whether the at least one of the plurality of switches is functioning based upon the measured output.

6. The method of claim 4, wherein the ADC includes a successive approximation register.

7. The method of claim 6, wherein the act of digitally testing comprises:
applying a digital signal code to control logic of the successive approximation register to selectively activate the plurality of switches according to the applied digital signal code.

8. The method of claim 7, wherein the selectively activating comprises placing one of the plurality of switches in a first state and the remaining switches in a second state different from the first state.

9. An analog-to-digital converter (ADC) comprising:
a plurality of switches for use in converting an analog input voltage to a digital output code corresponding to the analog input voltage;
a resistive network coupled to the plurality of switches;
an isolation switch configured to isolate one end of the resistive network from any reference potential; and
a digital test input configured to receive a signal for activating the plurality of switches.

10. The analog-to-digital converter of claim 9, wherein the digital test input is coupled to control logic configured to activate the plurality of switches.

11. The analog-to-digital converter of claim 10, wherein the control logic comprises a successive approximation register.

12. The analog-to-digital converter of claim 9, further comprising
a comparator coupled at a first input to an analog voltage input for the ADC and coupled at a second input to an output from the plurality of switches,
wherein the resistive network and plurality of switches are configured to alter the voltage at the second input of the comparator.

13. The analog-to-digital converter of claim 12, wherein the isolation switch is configured to isolate the resistive network from ground while testing the analog-to-digital converter.

14. The analog-to-digital converter of claim 13, further comprising an external voltage input for applying a voltage to the resistive network from a source external to the ADC.

15. The analog-to-digital converter of claim 12, further comprising:
measuring circuitry configured to measure a signal at the second input of the comparator; and
an isolation switch for isolating the measuring circuitry from the second input of the comparator.

16. The analog-to-digital converter of claim 15, wherein the measuring circuitry comprises:
a coupling to a reference voltage; and
logic circuitry configured to indicate whether the reference voltage is present at the second input of the comparator or whether an applied voltage to the resistive network is present at the second input of the comparator.

17. The analog-to-digital converter of claim 12, further comprising a multiplexor for selecting an output from the comparator or a signal from the digital test input for transmission to control logic configured to activate the plurality of switches.

* * * * *